(12) United States Patent
Fan et al.

(10) Patent No.: US 10,985,771 B2
(45) Date of Patent: Apr. 20, 2021

(54) METHOD OF CALIBRATING CAPACITIVE ARRAY OF SUCCESSIVE APPROXIMATION REGISTER ANALOG-TO-DIGITAL CONVERTER

(71) Applicant: University of Electronic Science and Technology of China, Chengdu (CN)

(72) Inventors: Hua Fan, Chengdu (CN); Chen Wang, Chengdu (CN); Peng Lei, Chengdu (CN); Dainan Zhang, Chengdu (CN); Quanyuan Feng, Chengdu (CN); Lang Feng, Chengdu (CN); Xiaopeng Diao, Chengdu (CN); Dagang Li, Chengdu (CN); Kelin Zhang, Chengdu (CN); Daqian Hu, Chengdu (CN); Yuanjun Cen, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/703,828

(22) Filed: Dec. 4, 2019

(65) Prior Publication Data
US 2021/0058091 A1 Feb. 25, 2021

(30) Foreign Application Priority Data
Aug. 21, 2019 (CN) .......................... 201910772581.3

(51) Int. Cl.
*H03M 1/10* (2006.01)
*H03M 1/46* (2006.01)

(52) U.S. Cl.
CPC ......... *H03M 1/1009* (2013.01); *H03M 1/462* (2013.01)

(58) Field of Classification Search
CPC ........ H03M 1/009; H03M 1/462; H03M 1/12; H03M 1/466
(Continued)

(56) References Cited

U.S. PATENT DOCUMENTS

| | | | |
|---|---|---|---|
| 10,103,742 B1* | 10/2018 | Guo | H03M 1/68 |
| 2007/0090986 A1* | 4/2007 | Komatsu | H03M 1/0827 |
| | | | 341/155 |

(Continued)

*Primary Examiner* — Peguy Jean Pierre
(74) *Attorney, Agent, or Firm* — Matthias Scholl P.C.; Matthias Scholl

(57) ABSTRACT

A method of calibrating capacitive array of a resistor-capacitor hybrid successive approximation register analog-to-digital converter (RC-hybrid SAR ADC) that includes a high M-bit capacitor DAC and a low N-bit resistor DAC. The method includes: disposing n unit capacitors in each capacitive array of the RC-hybrid SAR ADC, wherein $n=2^{M-1}$; sorting the capacitors in an ascending order according to their capacitances to form a sorted array, and selecting two capacitors $C_{u(n/2)}*$, $C_{u(n/2+1)}*$ in the middle positions as a least significant bit (LSB) capacitor and a dummy capacitor, respectively; obtaining a new array by forming each capacitor through adding two capacitors which have symmetrical positions with respect to the middle position(s) in the sorted array; and sorting the new array in an ascending order, and selecting the capacitor in the middle position as a higher bit capacitor. The method improves the static and dynamic performance of the SAR ADC.

1 Claim, 18 Drawing Sheets

(58) Field of Classification Search
USPC .................................. 341/172, 120, 118, 155
See application file for complete search history.

(56) References Cited

U.S. PATENT DOCUMENTS

| | | | | |
|---|---|---|---|---|
| 2008/0158028 | A1* | 7/2008 | Yang ..................... | H03M 1/109 |
| | | | | 341/118 |
| 2012/0081243 | A1* | 4/2012 | Kim ..................... | H03M 1/0678 |
| | | | | 341/110 |
| 2016/0105194 | A1* | 4/2016 | Kumbaranthodiyil ....................... | |
| | | | | H03M 1/1245 |
| | | | | 341/122 |

* cited by examiner 128 unit capacitors ($C_{ui}$) of the positive capacitive array;

The 1st time of sorting ($C_{ui}^*$), selecting (LSB & Dummy) & combining ($A_i$);

| $A_1^*$ | $A_2^*$ | $A_3^*$ | $A_4^*$ | $A_5^*$ | ... | $A_{28}^*$ | $A_{29}^*$ | $A_{30}^*$ | $A_{31}^*$ | $A_{32}^*$ |
|---------|---------|---------|---------|---------|-----|------------|------------|------------|------------|-------------|
| $A_{63}^*$ | $A_{62}^*$ | $A_{61}^*$ | $A_{60}^*$ | $A_{59}^*$ | ... | $A_{36}^*$ | $A_{35}^*$ | $A_{34}^*$ | $A_{33}^*$ | LSB+1 |
| $B_1$ | $B_2$ | $B_3$ | $B_4$ | $B_5$ | ... | $B_{28}$ | $B_{29}$ | $B_{30}$ | $B_{31}$ | |

The 2nd time of sorting ($A_i^*$), selecting (LSB+1) & combining ($B_i$);

FIG. 3C

| $B_1^*$ | $B_2^*$ | $B_3^*$ | $B_4^*$ | $B_5^*$ | ... | $B_{12}^*$ | $B_{13}^*$ | $B_{14}^*$ | $B_{15}^*$ | $B_{16}^*$ |
|---------|---------|---------|---------|---------|-----|------------|------------|------------|------------|-------------|
| $B_{31}^*$ | $B_{30}^*$ | $B_{29}^*$ | $B_{28}^*$ | $B_{27}^*$ | ... | $B_{20}^*$ | $B_{19}^*$ | $B_{18}^*$ | $B_{17}^*$ | LSB+2 |
| $C_1$ | $C_2$ | $C_3$ | $C_4$ | $C_5$ | ... | $C_{12}$ | $C_{13}$ | $C_{14}$ | $C_{15}$ | |

The 3rd time of sorting ($B_i^*$), selecting (LSB+2) & combining ($C_i$);

FIG. 3D

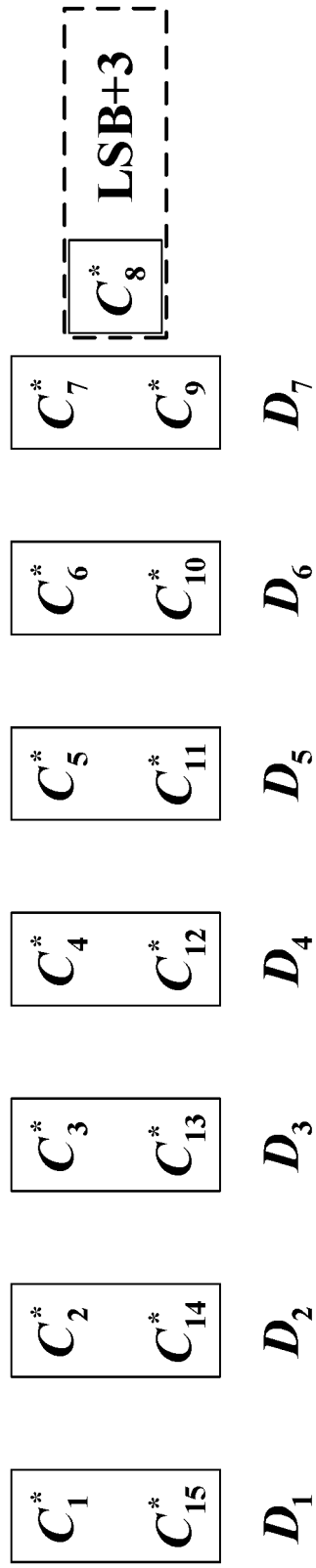
FIG. 3E
The 4th time of sorting ($C_i^*$), selecting (LSB+3) & combining ($D_i$);
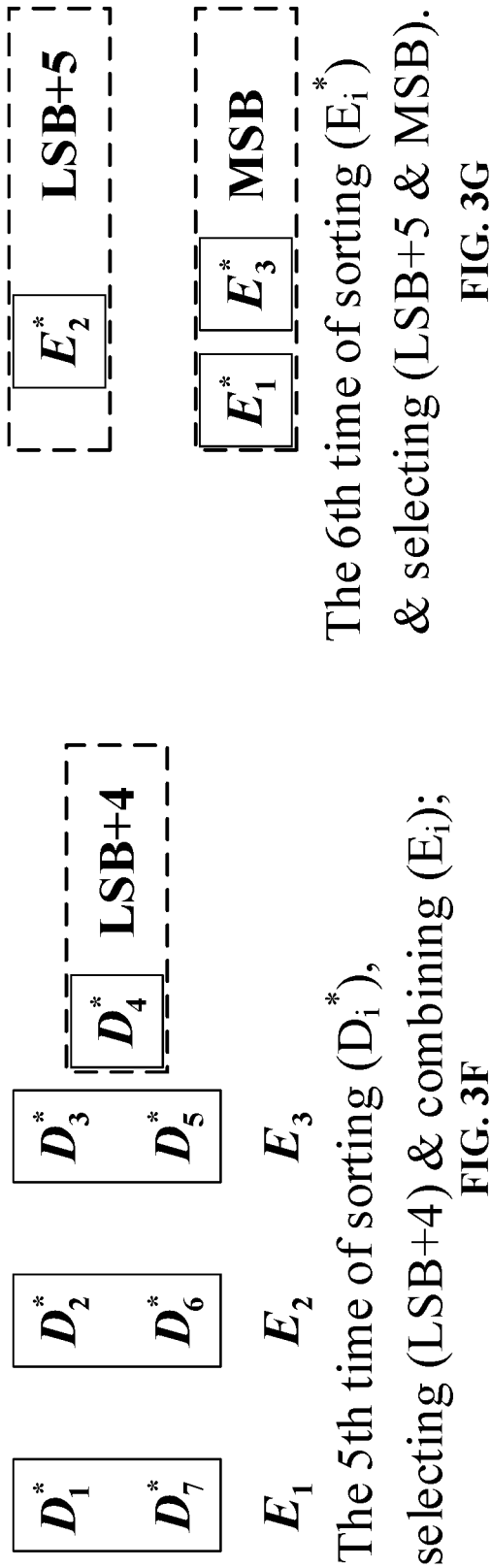
FIG. 3F
The 5th time of sorting ($D_i^*$), selecting (LSB+4) & combining ($E_i$);
FIG. 3G
The 6th time of sorting ($E_i^*$) & selecting (LSB+5 & MSB).

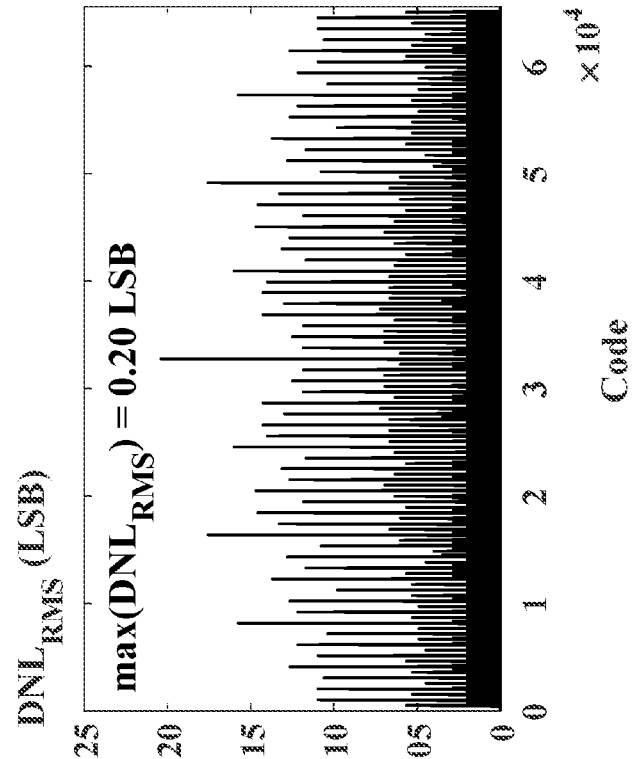
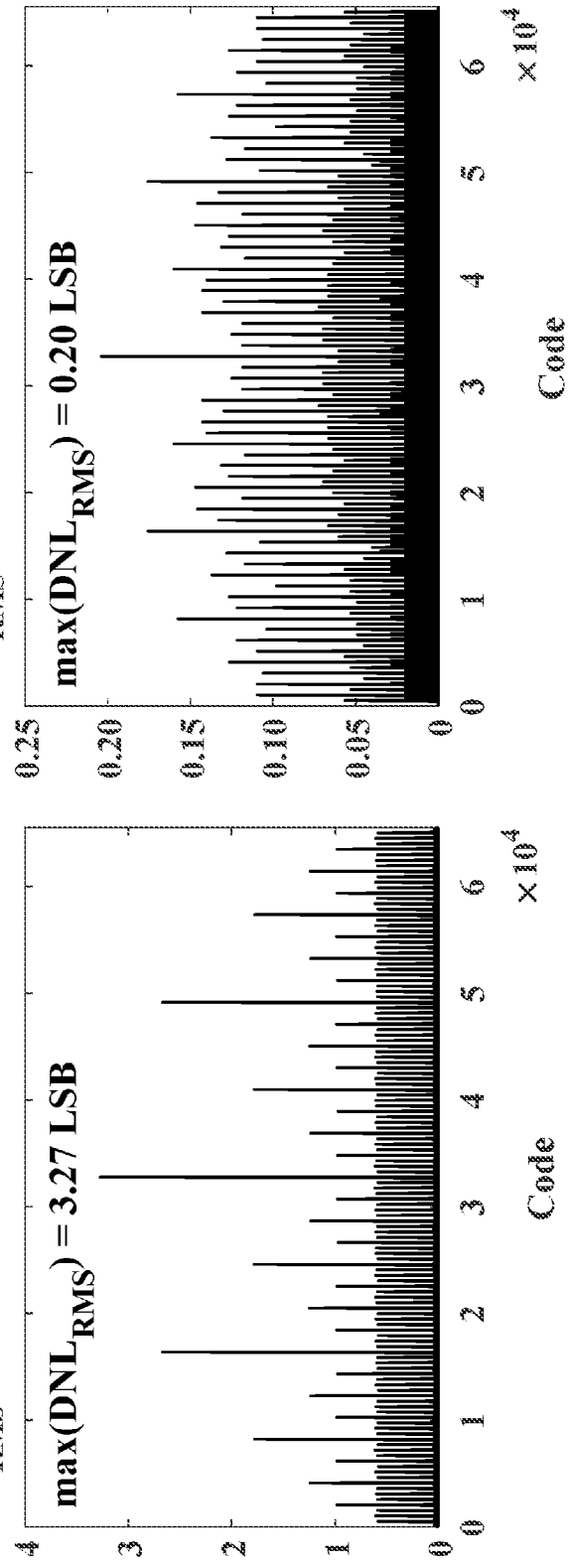
FIG. 5A
FIG. 5B

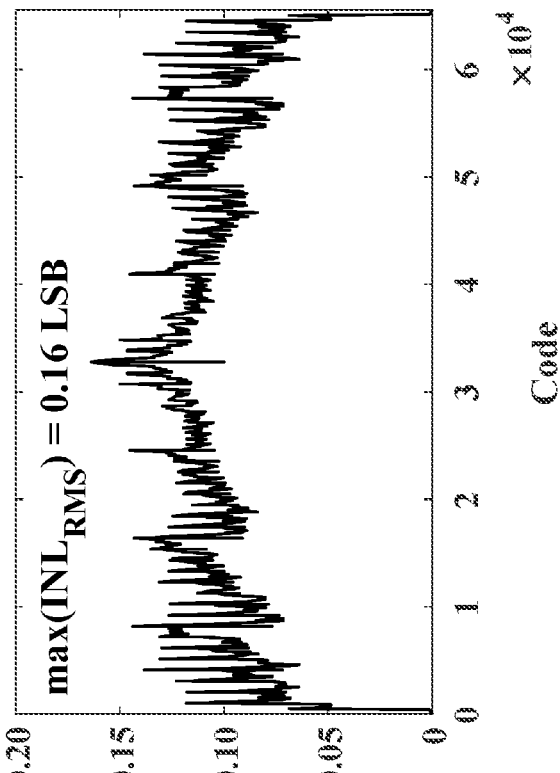
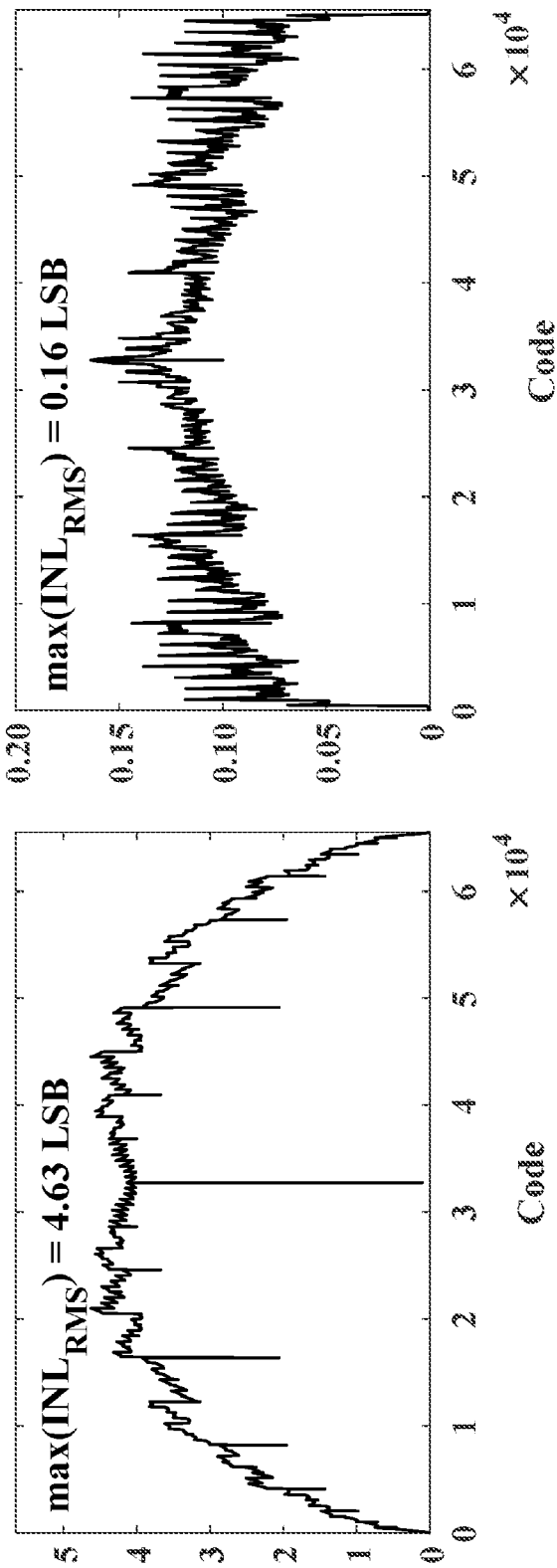
FIG. 5C
FIG. 5D

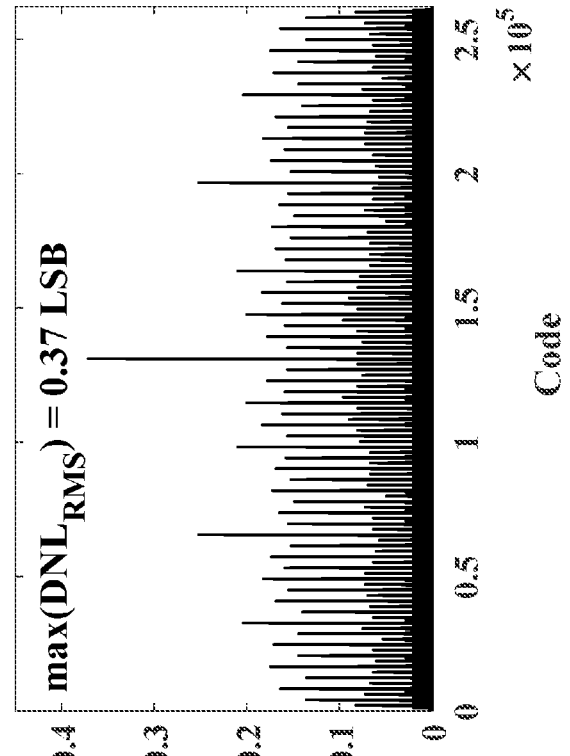
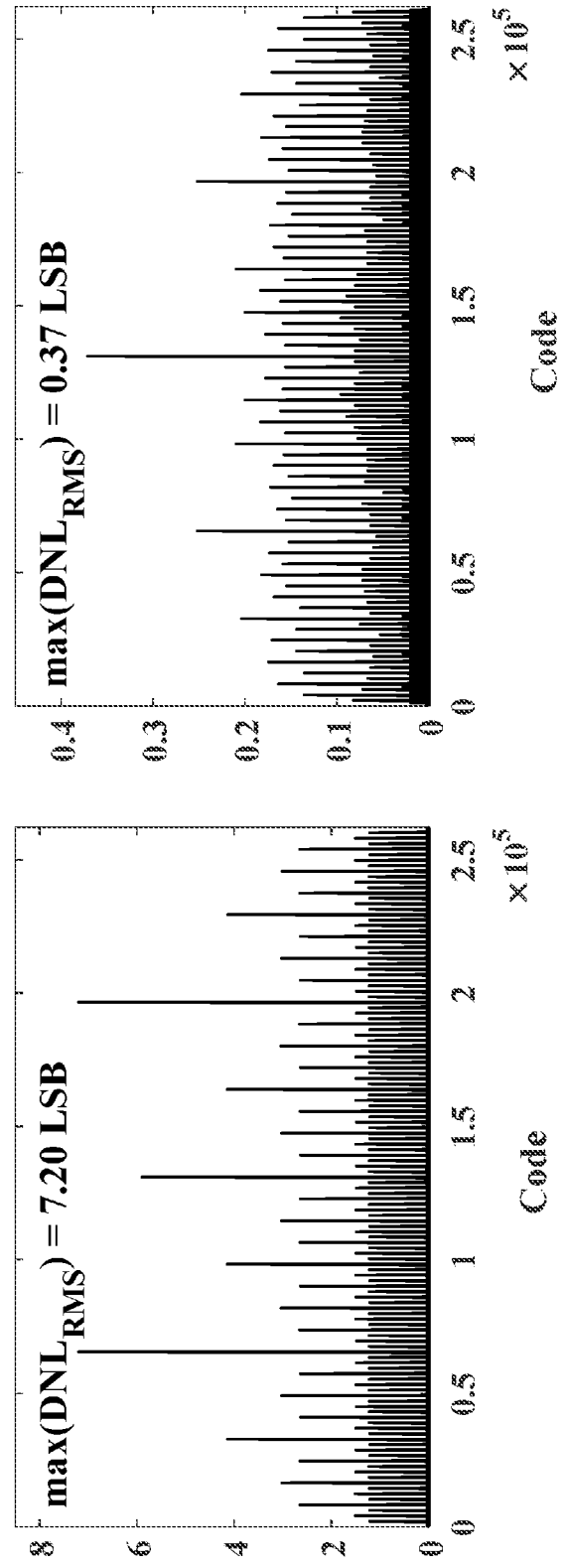
FIG. 6B
FIG. 6A

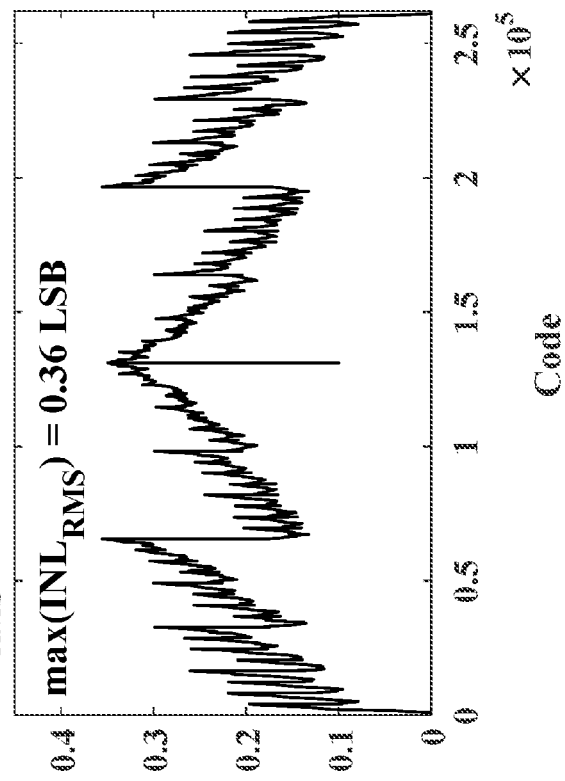
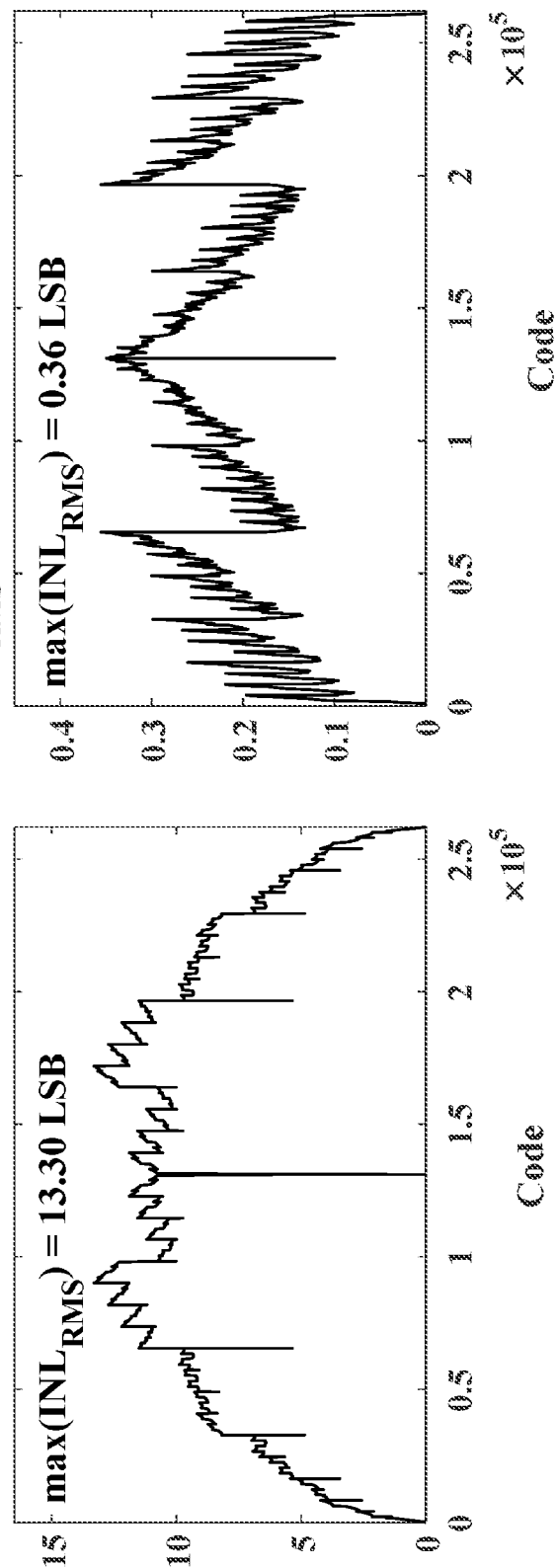
FIG. 6C
FIG. 6D

METHOD OF CALIBRATING CAPACITIVE ARRAY OF SUCCESSIVE APPROXIMATION REGISTER ANALOG-TO-DIGITAL CONVERTER

CROSS-REFERENCE TO RELATED APPLICATIONS

Pursuant to 35 U.S.C.§ 119 and the Paris Convention Treaty, this application claims foreign priority to Chinese Patent Application No. 201910772581.3 filed Aug. 21, 2019, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to the technical fields of microelectronics and solid-state electronics, and more particularly to a capacitor calibration method for the RC-hybrid successive approximation register (SAR) analog-to-digital converter (ADC).

Analog-to-digital converter (ADC) is a constituent part of nodes in wireless sensor networks. Common ADC architectures include SAR ADC, Flash ADC, Pipeline ADC, and $\Sigma$-$\Delta$ ADC.

The performance of SAR ADC is limited by element mismatch and noise. In the design of high-resolution SAR ADC, the selection of circuit architecture and calibration method is a key point. Conventionally, the binary-search gain calibration method can correct the inter-stage gain error, but the merged-residue-DAC leads to excessive power consumption of the DAC module. The digital calibration can track the change of the capacitor error caused by the power supply voltage and temperature change in real-time. However, the entire calibration is realized by software, without considering the non-ideal factors and complexity of the calibration.

SUMMARY

The disclosure provides a calibration method for capacitors, also known as median selection, which is applied to improve the static and dynamic performance of the successive approximation register analog-to-digital converter. The method comprises:

1) disposing n unit capacitors in a positive capacitive array and a negative capacitive array of a resistor-capacitor hybrid successive approximation register analog-to-digital converter (RC SAR ADC) respectively, and labeling the n unit capacitors as: $C_{u1}$, $C_{u2}$, $C_{u3}$, $C_{u4}$, ..., $C_{u(n-1)}$, $C_{un}$;
2) sorting the n unit capacitors in an ascending order according to their capacitances, and recording them as: $C_{u1}^*$, $C_{u2}^*$, $C_{u3}^*$, $C_{u4}^*$, ..., $C_{u(n-1)}^*$, $C_{un}^*$;
3) selecting two capacitors $C_{u(n/2)}^*$, $C_{u(n/2+1)}^*$ in a middle position of the capacitances as a least significant bit (LSB) and dummy capacitor of the analog-to-digital converter respectively;
4) combining $C_{u1}^*$ and $C_{un}^*$ into $A_1$, and combining $C_{u2}^*$ and $C_{u(n-1)}^*$ into $A_2$, ..., and combining $C_{u(n/2-1)}^*$ and $C_{u(n/2+2)}^*$ into $A_{(n/2-1)}$, to yield a first array $A_i$;
5) sorting the first array $A_i$ in an ascending order to obtain a second array $A_i^*$ comprising $A_1^*$, $A_2^*$, $A_3^*$, $A_4^*$, ..., $A_{(n/2-1)}^*$; selecting $A_{(n/4)}^*$, which is in a middle position of the second array $A_i^*$, as a second least significant bit (LSB+1);
6) combining $A_1^*$ and $A_{(n/2-1)}^*$ into $B_1$, combining $A_2^*$ and $A_{(n/2-2)}^*$ into $B_2$, $A_{(n/4-1)}^*$ and combining $A_{(n/4+)}^*$ into $B_{(n/4-1)}$, to yield a third array $B_i$;
7) sorting the third array & in an ascending order to obtain a fourth array $B_i^*$ comprising $B_{1*}$, $B_{2*}$, $B_{3*}$, $B_{4*}$, ..., $B_{(n/4-1)}^*$, and selecting $B_{(n/8)}^*$, which is in a middle position of the fourth array $B_i^*$, as a third least significant bit (LSB+2);
8) repeating 6) and 7) to get other higher bits of the analog-to-digital converter: LSB+3, LSB+4, ..., a most significant bit (MSB); and
9) employing the dummy capacitor, the LSB, the LSB+1, the LSB+2, ..., the MSB as a capacitive array of the RC-hybrid SAR ADC for analog-to-digital conversion.

The capacitor mismatch calibration method based on RC-hybrid SAR ADC provided by the disclosure is applicable for any kind of data converters. Median selection compensates the capacitor mismatch of ADC by selecting and combining the unit capacitors. Compared with the conventional calibration method, the median selection method improves the static and dynamic performance of the SAR ADC.

BRIEF DESCRIPTION OF THE DRAWINGS

FIG. 2A shows the top plates of all the unit capacitors are switched to VCM. The bottom plate of $C_{u1}$ in the positive capacitive array is switched to $V_{REFP}$ and the other bottom plates are switched to $V_{REFN}$. The bottom plate of $C_{u1}$ in the negative capacitive array is switched to VREFN and the other bottom plates are switched to VREFP. FIG. 2B shows the top plates of all the unit capacitors disconnects with $V_{REFF}$; the bottom plate of $C_{u2}$ in the positive capacitive array is switched to VREFP and the other bottom plates are switched to VREFN. The bottom plate of $C_{u2}$ in the negative capacitive array is switched to VREFN and the other bottom plates are switched to VREFP.

FIGS. 3A-3G show the combination, sorting and median selection of capacitors according to one embodiment of the disclosure.

FIGS. 5A-5D are static simulation results of 16-bit SAR ADC according to one embodiment of the disclosure.

FIGS. 6A-6D are static simulation results of 18-bit SAR ADC according to one embodiment of the disclosure.

DETAILED DESCRIPTION

Figure 1:
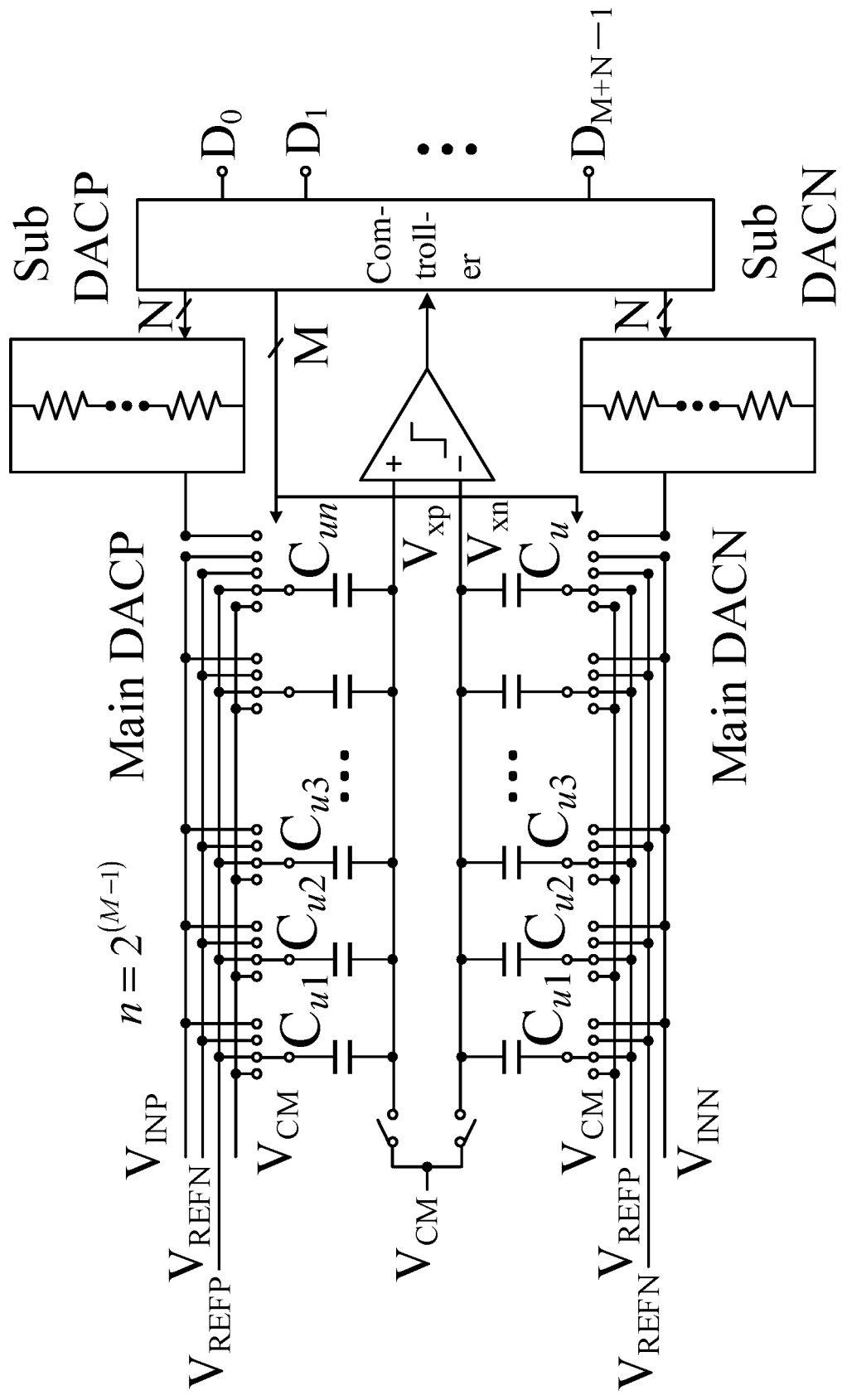
FIG. 1 is a schematic diagram of a RC-hybrid SAR ADC in the prior art.

The disclosure provides a capacitor mismatch calibration method, which also known as median selection. A 14-bit RC-hybrid SAR ADC comprising a high 8-bit capacitor DAC and a low 6-bit resistor DAC is taken as an example for detailed description. The structure of the M+N-bit RC-hybrid SAR ADC with high M-bit capacitor DAC and low N-bit resistor DAC is shown in FIG. 1.

If M=8, N=6, it means a 14-bit SAR ADC composed of a high 8-bit capacitor DAC and a low 6-bit resistor DAC. There are 128 unit capacitors in the positive capacitive array and the negative capacitive array respectively: $C_{u1}, C_{u2}, C_{u3}, C_{u4}, C_{u127}, C_{u128}$. 128 unit capacitors should be equal in value, but in fact, they are not completely equal after manufacture. In general, the mismatch errors of the capacitors are supposed to be a standard Gaussian distribution.

Figure 2A:
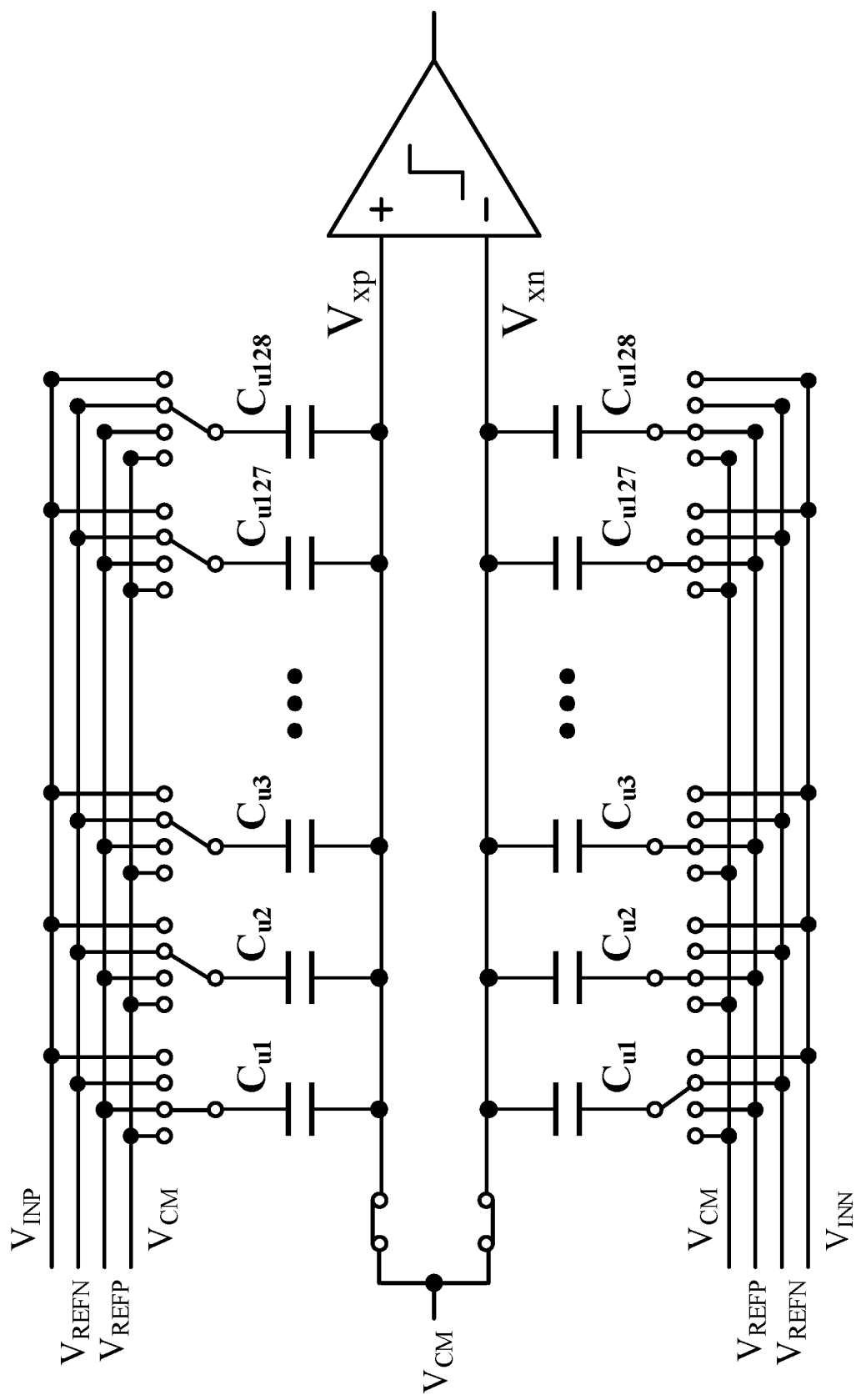
FIGS. 2A-2B show the comparison of the unit capacitors $C_{u1}$ and $C_{u2}$ in two steps in the prior art.
Figure 2B:
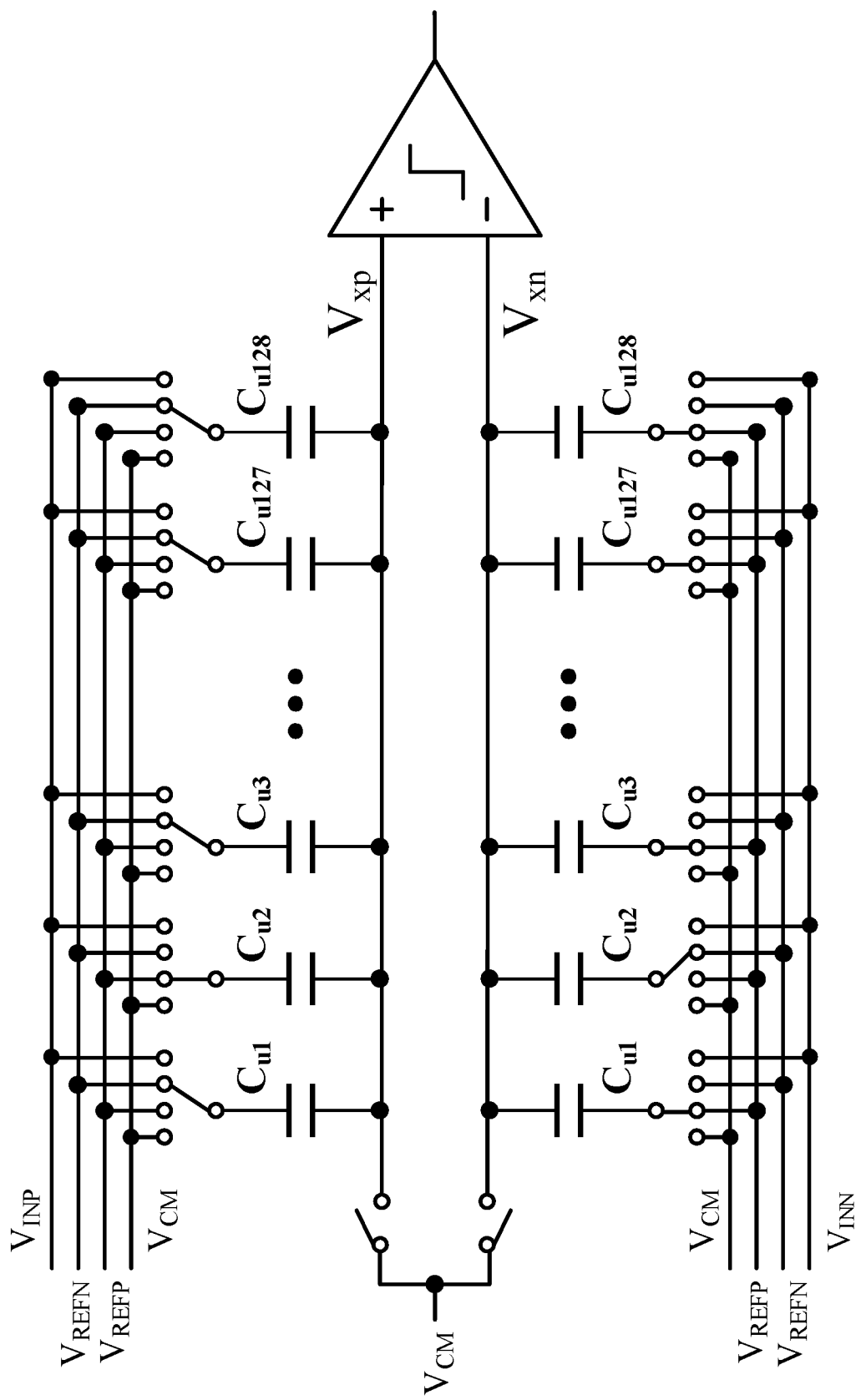

128 unit capacitors are sorted in the ascending order according to their value for the first time and labeled as $C_{u1}*, C_{u2}*, C_{u3}*, C_{u4}*, C_{u127}*, C_{u128}*$. A method similar to FIGS. 2A-2B can be used to complete the comparison between every two capacitors. And FIGS. 2A-2B show the schematic diagram of the comparison between $C_{u1}$ and $C_{u2}$ in two steps.

Figure 3A:
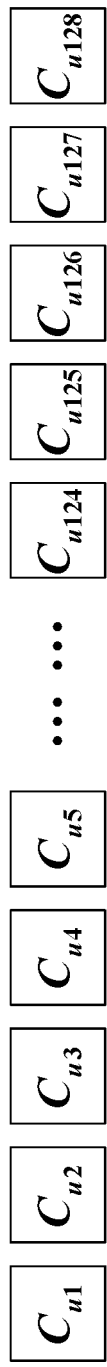
Figure 3B:
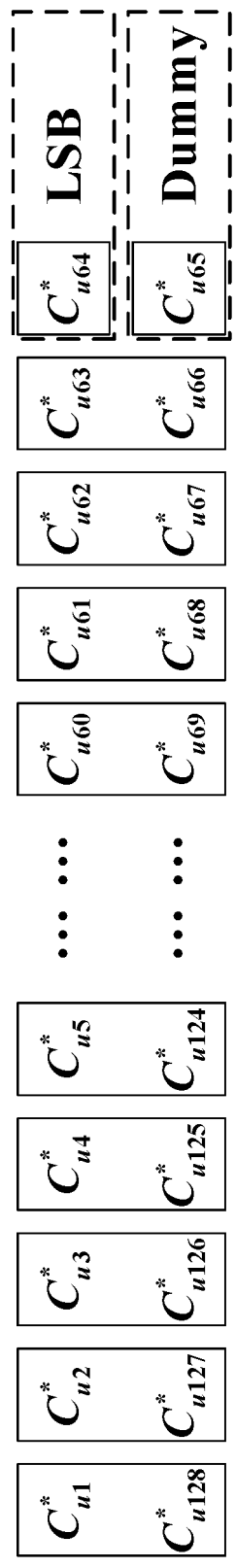
Figures 4A, 4B:
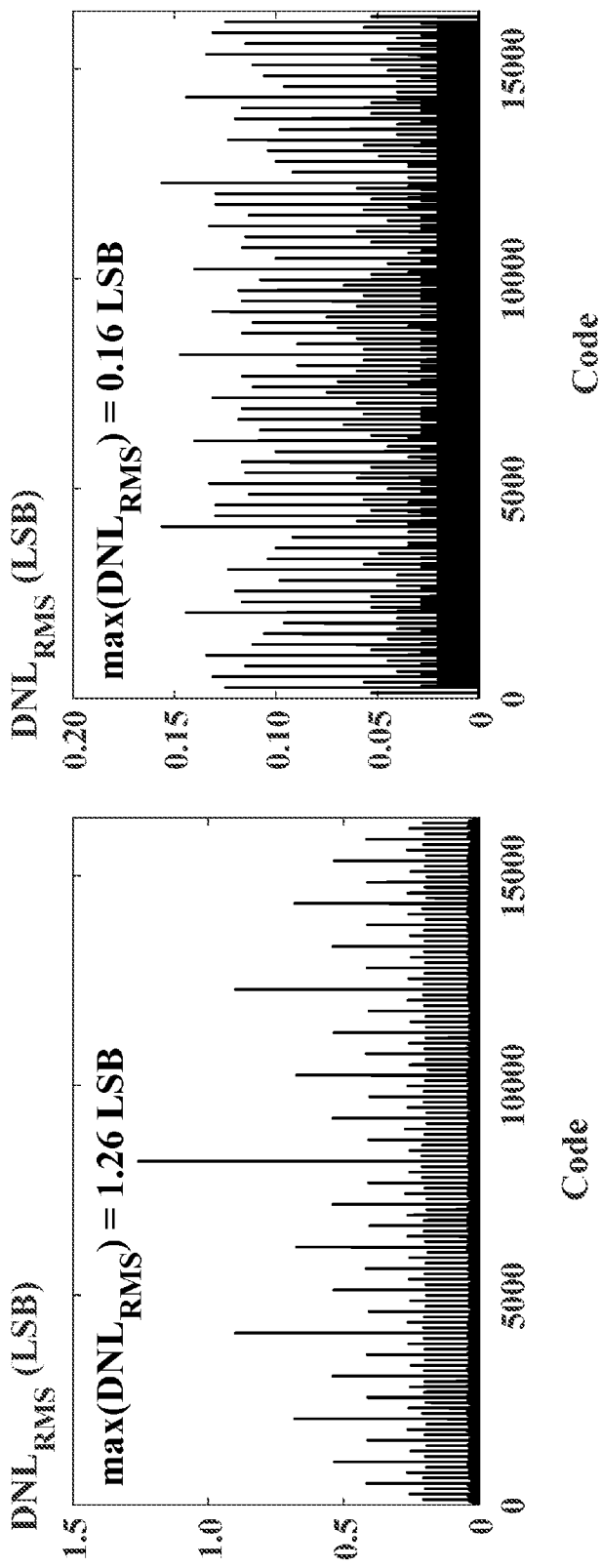
FIGS. 4A-4D are static simulation results of 14-bit SAR ADC according to one embodiment of the disclosure.
Figures 4C, 4D:
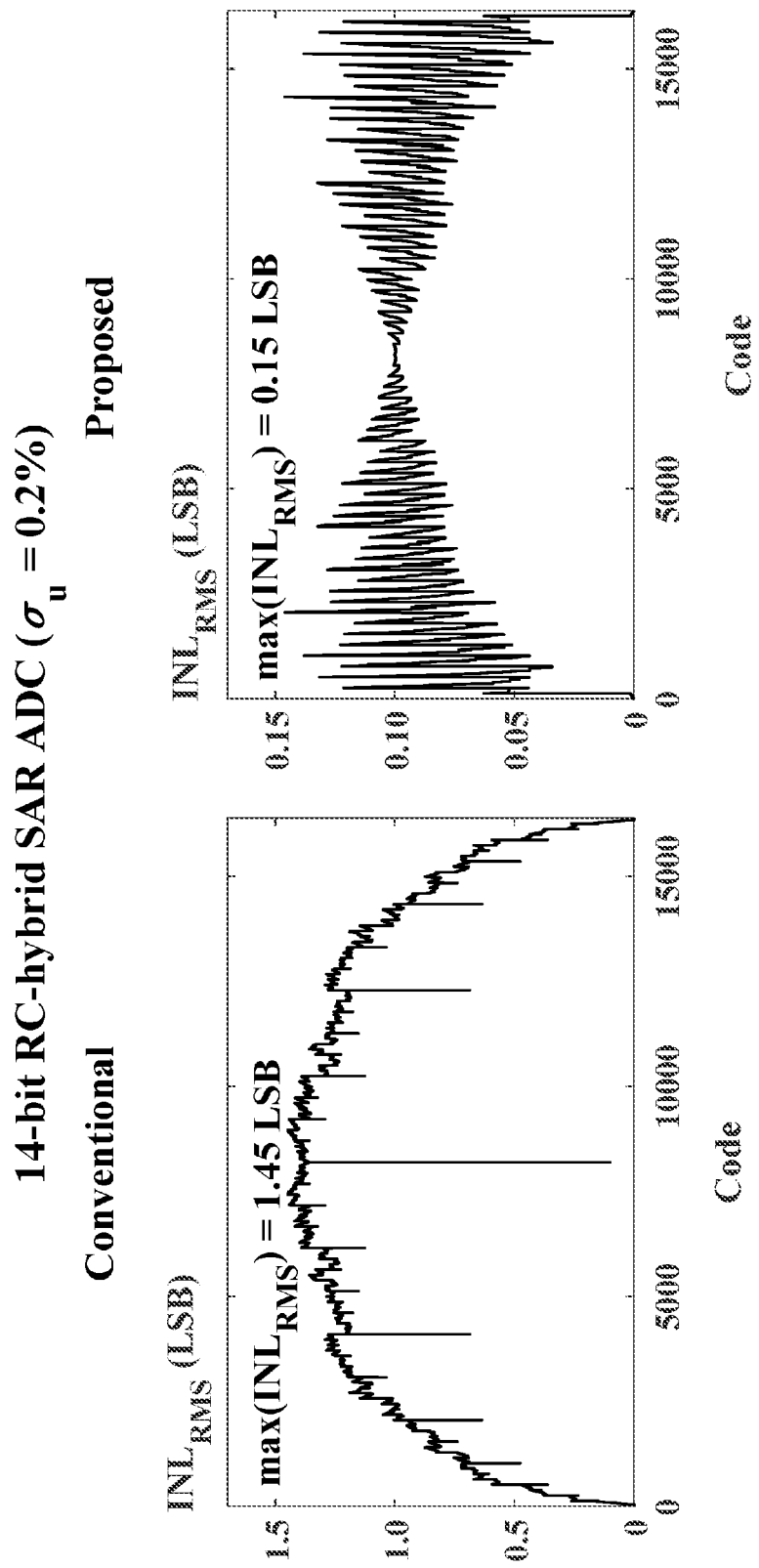
Figures 7A, 7B:
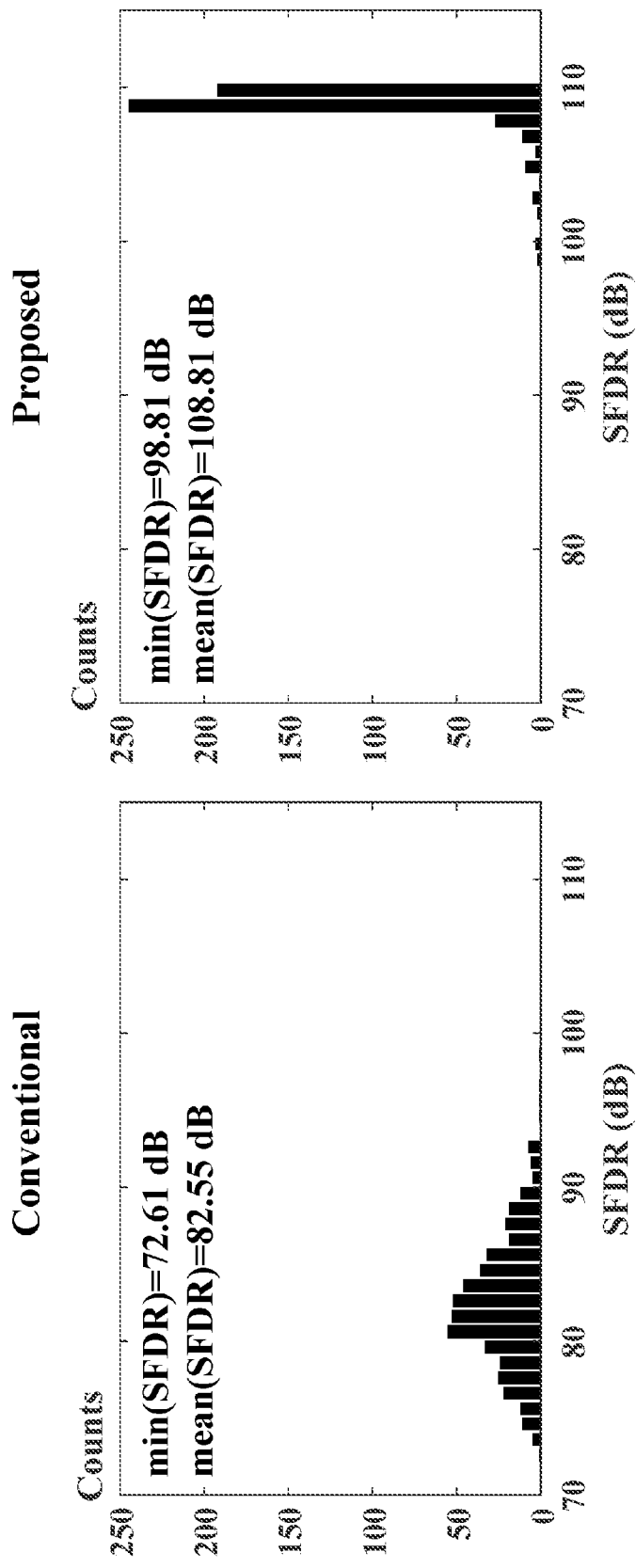
FIGS. 7A-7D are dynamic simulation results of 14-bit SAR ADC according to one embodiment of the disclosure.
Figures 7C, 7D:
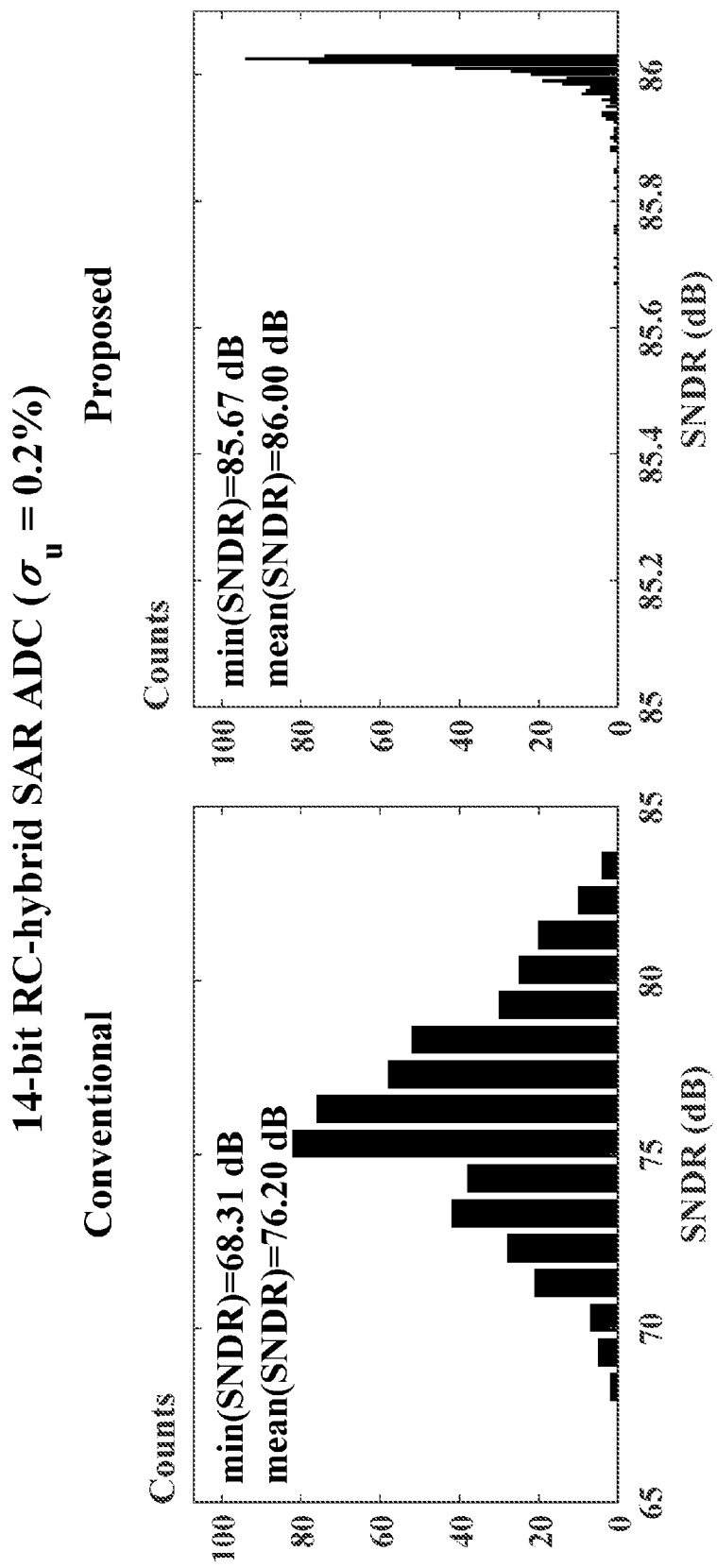
Figure 8A:
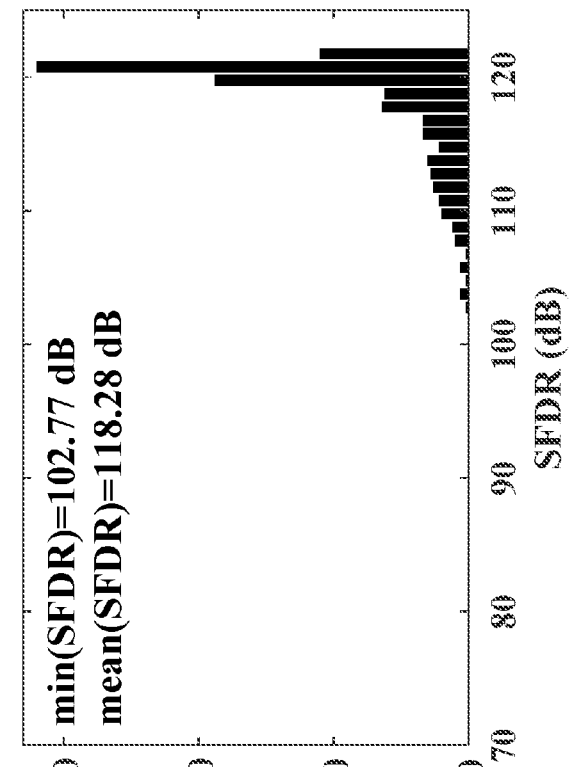
FIGS. 8A-8D are dynamic simulation results of 16-bit SAR ADC according to one embodiment of the disclosure.
Figure 8B:
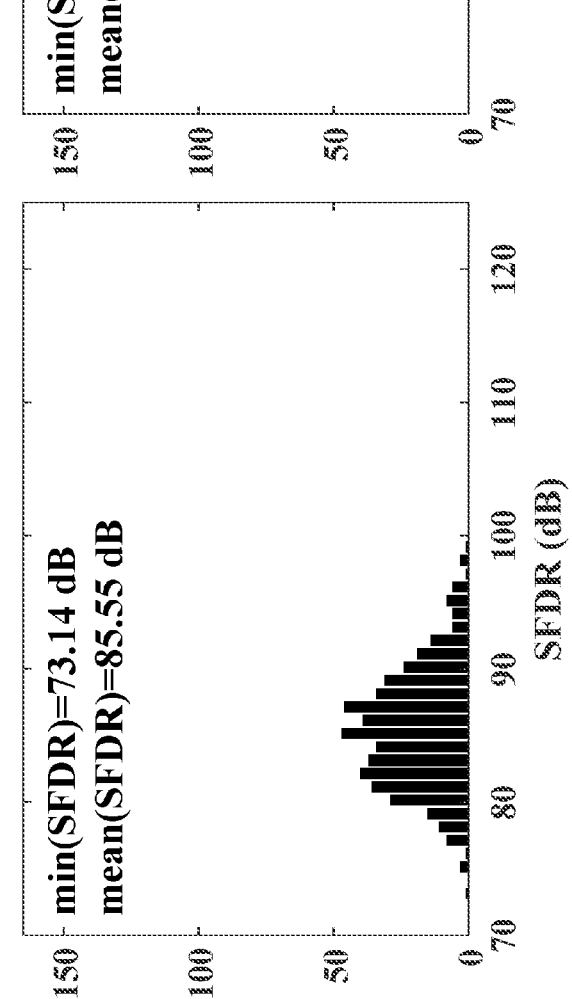
Figures 8C, 8D:
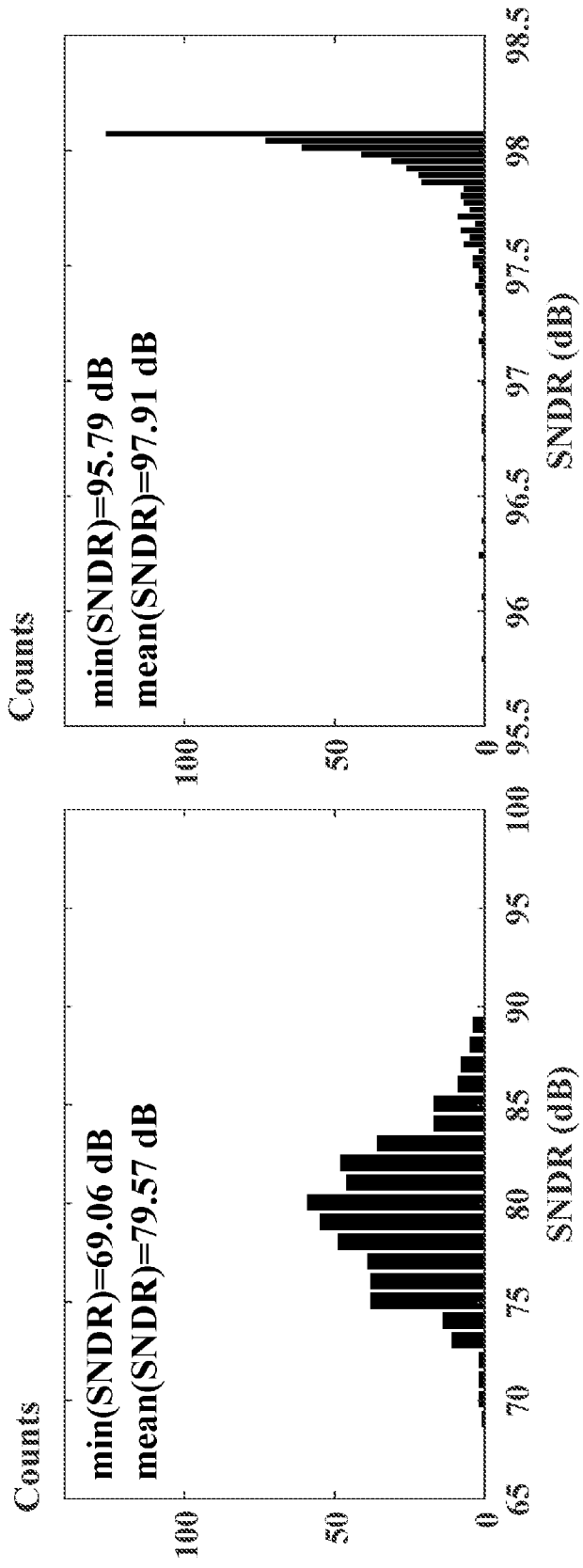
Figure 9A:
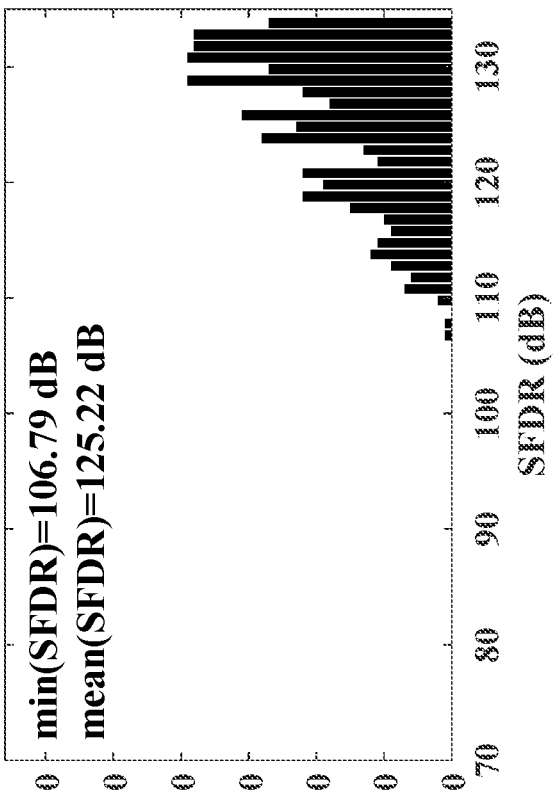
FIGS. 9A-9D are dynamic simulation results of 18-bit SAR ADC according to one embodiment of the disclosure.
Figure 9B:
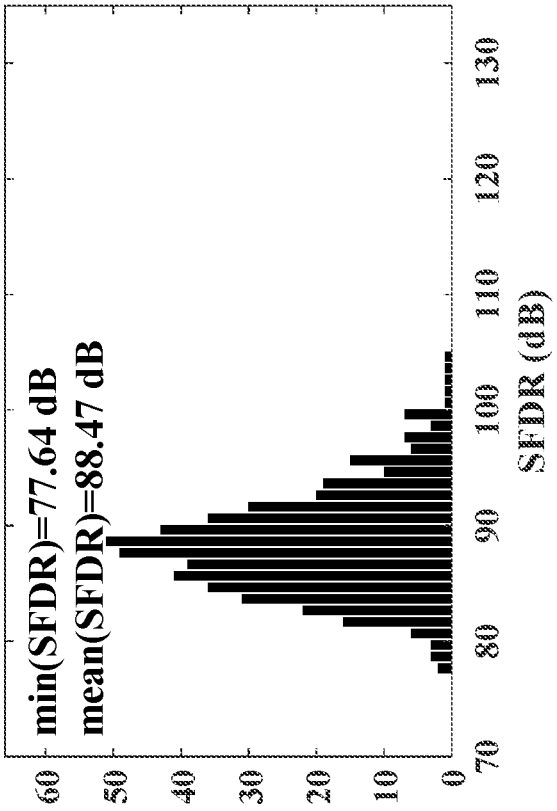
Figures 9C, 9D:
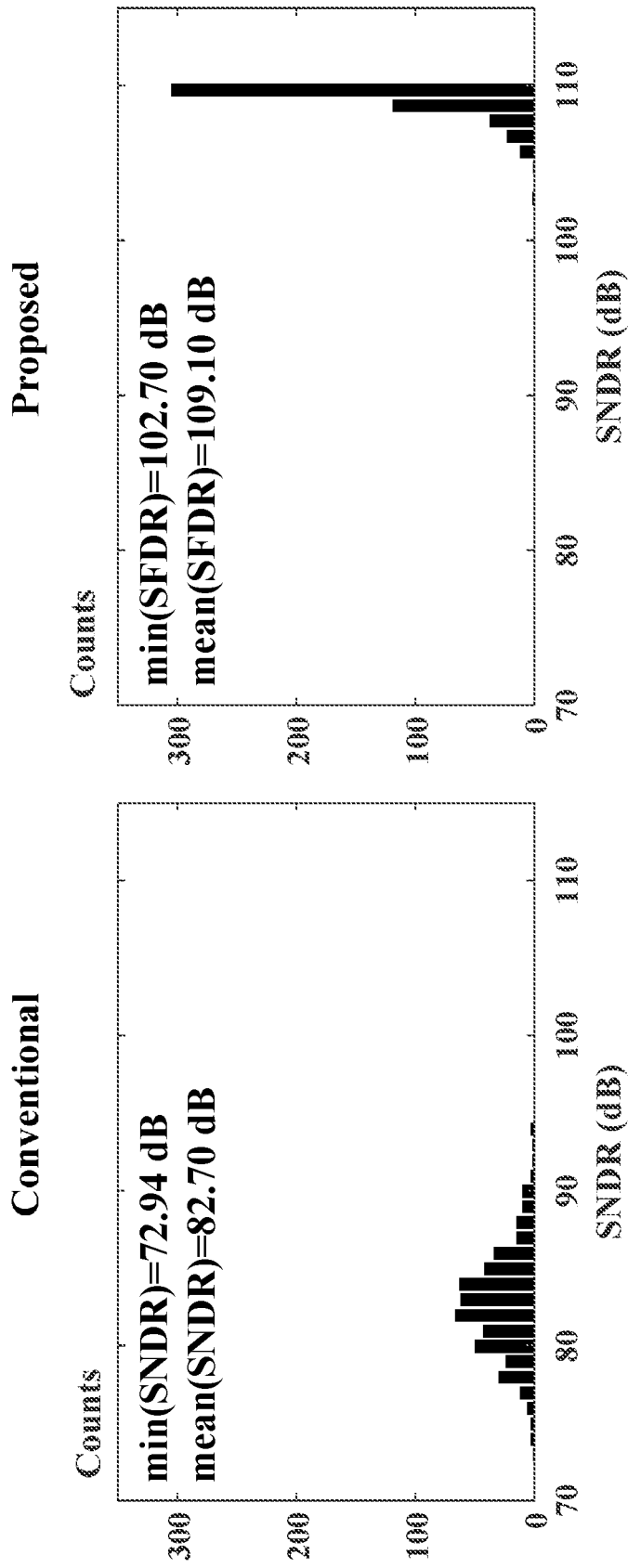

As shown in FIG. 3B, the median selection is used for the first time of selecting: the two capacitors in the middle position ($C_{u64}*$ and $C_{u65}*$) are selected as the least significant bit (LSB) and dummy capacitor of the converter respectively. The remaining capacitors are then combined for the first time: $C_{u1}*$ and $C_{u128}*$ are combined into $A_1$, $C_{u2}*$ and $C_{u127}*$ are combined into $A_2$, ..., $C_{u63}*$ and $C_{u66}*$ are combined into $A_{63}$.

As shown in FIG. 3C, $A_i$ is sorted in the ascending order again to obtain a new array of $A_i*$: $A_1*, A_2*, A_3*, A_4*, \ldots, A_{63}*$. And $A_{32}*$, which is in the median position of $A_i*$, is selected as the second least significant bit (LSB+1). And the same process above is repeat, the remaining capacitors are then selected and combined as shown in FIGS. 3D-3G to get the other higher bits of the converter: LSB+2, LSB+3, ..., MSB (the most significant bit).

For 16-bit RC-hybrid SAR ADC composed of a high 8-bit capacitor DAC and a low 8-bit resistor DAC (M=8 and N=8 in FIG. 1), 18-bit RC-hybrid SAR ADC composed of a high-order 8-bit capacitor DAC and a low 10-bit resistor DAC (M=8 and N=10 in FIG. 1), these capacitors are sorted and reconstructed using the provided median selection method. The method is identical to the 14-bit RC-hybrid SAR ADC consisting of a high 8-bit capacitor DAC and a low 6-bit resistor DAC.

To evaluate the performance improvement of the provided median selection, 14-bit, 16-bit, and 18-bit RC-hybrid SAR ADC are simulated in Matlab to run extensive Monte Carlo simulations with the mismatch of capacitors ($\alpha_u=\sigma_0/C_0$) of 0.2%, 0.15% and 0.1% separately. For the static simulation (differential nonlinearity (DNL) and integral nonlinearity (INL)), the Monte Carlo simulation time is set at 100. And for the dynamic simulation (spurious free dynamic range (SFDR) and signal-to-noise-and-distortion ratio (SNDR)), the Monte Carlo simulation time is set at 500.

The static simulation results of RC-hybrid SAR ADC are shown in FIGS. 4A-6D and summarized in Table 1. It can be found that for the maximum root-mean-square (RMS) of DNL, the 14-bit, 16-bit, 18-bit RC-hybrid SAR ADC are improved by 87.3%, 93.9%, and 94.9% to 0.16 LSB, 0.20 LSB and 0.37 LSB respectively, while the maximum RMS of INL are improved by 89.7%, 96.5%, 97.3% to 0.15 LSB, 0.16 LSB and 0.36 LSB with the median selection.

The dynamic simulation results of RC-hybrid SAR ADC are shown in FIGS. 7A-9D and summarized in Table 2. For 14-bit SAR ADC, the worst-case of SFDR is improved from 72.61 dB to 98.81 dB and the worst-case of SNDR is improved from 68.31 dB to 85.67 dB by the provided median selection. Compared with the conventional SAR ADC, the mean of SFDR and SNDR is improved by 26.26 dB and 9.80 dB respectively. For 16-bit SAR ADC after calibration, the worst-case of SFDR is improved from 73.14 dB to 102.77 dB and the worst-case of SNDR is improved from 69.06 dB to 95.79 dB. And the provided median selection improves the mean of SFDR and SNDR by 32.73 dB and 18.34 dB respectively. For 18-bit SAR ADC, the median selection improves the worst-case of SFDR from 77.64 dB to 106.79 dB and improves the worst-case of SNDR from 72.94 dB to 102.70 dB. The mean of SFDR is enhanced by 36.75 dB, while the mean of SNDR is 26.40 dB higher than the median selection.

The capacitor calibration method based on median selection is applicable for any kind of data converters. Compared with the conventional calibration method, the median selection method improves the static and dynamic performance of the SAR ADC.

TABLE 1

Summary of 100 Monte Carlo simulation results of maximum RMS of DNL and INL

| | | Conventional | Provided | Improvement |
|---|---|---|---|---|
| 14-bit | DNL(LSB) | 1.26 | 0.16 | 1.10 |
| ($\sigma_u$ = 0.2%) | INL(LSB) | 1.45 | 0.15 | 1.30 |
| 16-bit | DNL(LSB) | 3.27 | 0.20 | 3.07 |
| ($\sigma_u$ = 0.15%) | INL(LSB) | 4.63 | 0.16 | 4.47 |
| 18-bit | DNL(LSB) | 7.20 | 0.37 | 6.83 |
| ($\sigma_u$ = 0.1%) | INULSB) | 13.30 | 0.36 | 12.94 |

TABLE 2

Summary of 500 Monte Carlo simulation results of SFDR and SNDR

| | | | Conventional | Provided | Improvement |
|---|---|---|---|---|---|
| 14-bit | SFDR | Min | 72.61 | 98.81 | 26.20 |
| ($\sigma_u$ = 0.2%) | (dB) | Mean | 82.55 | 108.81 | 26.26 |
| | SNDR | Min | 68.31 | 85.67 | 17.36 |
| | (dB) | Mean | 76.20 | 86.00 | 9.80 |
| 16-bit | SFDR | Min | 73.14 | 102.77 | 29.63 |
| ($\sigma_u$ = 0.15%) | (dB) | Mean | 85.55 | 118.28 | 32.73 |
| | SNDR | Min | 69.06 | 95.79 | 26.73 |
| | (dB) | Mean | 79.57 | 97.91 | 18.34 |
| 18-bit | SFDR | Min | 77.64 | 106.79 | 29.15 |
| ($\sigma_u$ = 0.1%) | (dB) | Mean | 88.47 | 125.22 | 36.75 |
| | SNDR | Min | 72.94 | 102.70 | 29.76 |
| | (dB) | Mean | 82.70 | 109.10 | 26.40 |

It will be obvious to those skilled in the art that changes and modifications may be made, and therefore, the aim in the appended claims is to cover all such changes and modifications.

What is claimed is:

1. A method for calibrating capacitive array of a resistor-capacitor hybrid successive approximation register analog-to-digital converter (RC-hybrid SAR ADC), wherein the RC-hybrid SAR ADC comprising a high M-bit capacitor DAC and a low N-bit resistor DAC, M represents the bit number of the high M-bit capacitor DAC, and N represents the bit number of the low N-bit capacitor DAC; the method comprising:
   1) disposing n unit capacitors in a positive capacitive array and a negative capacitive array of the RC-hybrid SAR ADC, respectively, and labeling the n unit capacitors as: $C_{u1}, C_{u2}, C_{u3}, C_{u4}, \ldots, C_{u(n-1)}, C_{un}$, wherein $n=2^{M-1}$;

2) sorting the n unit capacitors in an ascending order according to their capacitances, and recording them as: $C_{u1}{}^*$, $C_{u2}{}^*$, $C_{u3}{}^*$, $C_{u4}{}^*$, ..., $C_{u(n-1)}{}^*$, $C_{un}{}^*$;

3) selecting the capacitor $C_{u(n/2)}{}^*$ in a $(2^{M-1}/2^{(0+1)}=2^{M-(0+2)})^{th}$ position of the capacitances as a least significant bit (LSB) capacitor in each of the positive capacitive array and the negative capacitive array of the RC-hybrid SAR ADC, wherein the LSB capacitor has a bit position number of 0; and selecting the capacitor $C_{u(n/2+1)}{}^*$ in $(2^{M-2}+1)^{th}$ position of the capacitances as a dummy capacitor in each of the positive capacitive array and the negative capacitive array of the RC-hybrid SAR ADC;

4) combining $C_{u1}{}^*$ and $C_{un}{}^*$ into $A_1$, and combining $C_{u2}{}^*$ and $C_{u(n-1)}{}^*$ into $A_2$, ..., and combining $C_{u(n/2-1)}{}^*$ and $C_{u(n/2+2)}{}^*$; into $A_{(n/2-1)}$, to yield a first array $A_i$;

5) sorting the first array $A_1$ in an ascending order to obtain a second array $A_i{}^*$ comprising $A_1{}^*$, $A_2{}^*$, $A_3{}^*$, $A_4{}^*$, ..., $A_{(n/2-1)}{}^*$; selecting $A_{(n/4)}{}^*$, which is in a $(2^{M-1}/2^{(1+1)}=2^{M-(1+2)})^{th}$ position of the second array $A_i{}^*$, as a second least significant bit (LSB+1) capacitor in each of the positive capacitive array and the negative capacitive array of the RC-hybrid SAR ADC, wherein the (LSB+1) capacitor has a bit position number of 1;

6) combining $A_1{}^*$ and $A_{(n/2-1)}{}^*$ into $B_1$, combining $A_2{}^*$ and $A_{(n/2-2)}{}^*$ into $B_2$, ..., $A_{(n/4-1)}{}^*$ and combining $A_{(n/4+1)}{}^*$ into $B_{(n/4-1)}$, to yield a third array $B_i$;

7) sorting the third array $B_i$ in an ascending order to obtain a fourth array $B_i{}^*$ comprising $B_1{}^*$, $B_2{}^*$, $B_3{}^*$, $B_4{}^*$, ..., $B_{(n/4-1)}{}^*$, and selecting $B_{(n/8)}{}^*$, which is in a $(2^{M-1}/2^{(2+1)}=2^{M-(2+2)})^{th}$ position of the fourth array $A_i{}^*$, as a third least significant bit (LSB+2) capacitor in each of the positive capacitive array and the negative capacitive array of the RC-hybrid SAR ADC, wherein the (LSB+2) capacitor has a bit position number of 2;

8) repeating 6) and 7) to get other higher bit capacitors in each of the positive capacitive array and the negative capacitive array of the RC-hybrid SAR ADC; and 9) sorting the second to final array E comprising $E_1$, $E_2$, $E_3$ in an ascending order to obtain the final array $E_i{}^*$ comprising $E_1{}^*$, $E_2{}^*$, $E_3{}^*$, and selecting $E_2{}^*$, which is in a $(2^{M-1}/2^{(m-1+1)}=2^{M-(m-1+2)})^{th}$ position of the final array $E_i{}^*$, as a (LSB+m−1) capacitor in each of the positive capacitive array and the negative capacitive array of the RC-hybrid SAR ADC, wherein the (LSB+m−1) capacitor has a bit position number of m−1, m is an integer and larger than 3, and M=m+2;

and combining $E_1{}^*$ and $E_3{}^*$ to obtain a (LSB+m) capacitor that is a most significant bit (MSB) capacitor and has a bit position number of m.

* * * * *